(12) United States Patent
Akimoto

(10) Patent No.: US 8,067,793 B2
(45) Date of Patent: Nov. 29, 2011

(54) SEMICONDUCTOR DEVICE INCLUDING STORAGE CAPACITOR WITH YTTRIUM OXIDE CAPACITOR DIELECTRIC

(75) Inventor: Kengo Akimoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 305 days.

(21) Appl. No.: 12/235,934

(22) Filed: Sep. 23, 2008

(65) Prior Publication Data

US 2009/0085081 A1 Apr. 2, 2009

(30) Foreign Application Priority Data

Sep. 27, 2007 (JP) ................. 2007-250356

(51) Int. Cl.
*H01L 27/108* (2006.01)
*H01L 29/94* (2006.01)
*H01L 29/66* (2006.01)

(52) U.S. Cl. ........ 257/303; 257/301; 257/310; 257/353; 257/E27.092

(58) Field of Classification Search .............. 257/310, 257/353, 301, 303, E27.092; 438/155, 164, 438/240, 244, 245, 250, 253
See application file for complete search history.

(56) References Cited

U.S. PATENT DOCUMENTS

| | | | |
|---|---|---|---|
| 6,372,609 B1 | 4/2002 | Aga et al. | |
| 7,119,365 B2 | 10/2006 | Takafuji et al. | |
| 7,755,113 B2 | 7/2010 | Yamazaki et al. | |
| 2002/0055206 A1* | 5/2002 | Zhang | 438/145 |
| 2003/0215996 A1* | 11/2003 | Putkonen | 438/240 |
| 2004/0065882 A1* | 4/2004 | Yamazaki et al. | 257/59 |
| 2008/0248629 A1 | 10/2008 | Yamazaki et al. | |
| 2009/0075456 A1 | 3/2009 | Akimoto et al. | |

FOREIGN PATENT DOCUMENTS

| | | |
|---|---|---|
| JP | 05-109629 A | 4/1993 |
| JP | 11-163363 A | 6/1999 |

* cited by examiner

*Primary Examiner* — Matthew C Landau
*Assistant Examiner* — Daniel Luke
(74) *Attorney, Agent, or Firm* — Eric J. Robinson; Robinson Intellectual Property Law Office, P.C.

(57) ABSTRACT

A method for manufacturing a semiconductor device with high response speed and high reliability. In the method for manufacturing a semiconductor device of the invention, a bonding layer is formed over a substrate, an insulating film and a storage capacitor portion lower electrode are formed over the bonding layer, a single crystal silicon layer is formed over the insulating film, a storage capacitor portion insulating film is formed over the storage capacitor portion lower electrode, a wiring is formed over the storage capacitor portion insulating film, a channel forming region and a low concentration impurity region are formed over the single crystal silicon layer, and a gate insulating film and a gate electrode are formed over the single crystal silicon layer. The storage capacitor portion insulating film is formed by depositing a YSZ film with a single crystal silicon layer used as a base film, whereby the permittivity increases and thus the leakage current from the storage capacitor portion is suppressed.

18 Claims, 8 Drawing Sheets

SEMICONDUCTOR DEVICE INCLUDING STORAGE CAPACITOR WITH YTTRIUM OXIDE CAPACITOR DIELECTRIC

BACKGROUND OF THE INVENTION

1. Field of the Invention

The present invention relates to a semiconductor device and a method for manufacturing the same. In particular, the invention relates to a substrate having an SOI (silicon on insulator) structure in which a semiconductor layer is formed by slicing a crystalline semiconductor substrate and bonded to a different kind of substrate. More particularly, the invention relates to a bonding SOI technique and a method for manufacturing an SOI substrate in which a single crystal or polycrystalline semiconductor layer is bonded to a substrate having an insulating surface such as a glass substrate. Furthermore, the invention relates to a display device or a semiconductor device having such an SOI structure.

2. Description of the Related Art

Instead of silicon wafers manufactured by slicing a single crystal semiconductor ingot, semiconductor substrates called silicon on insulators (SOI substrates) in which a thin single crystal semiconductor layer is provided over an insulating layer have been developed and are becoming widely used as substrates in manufacturing microprocessors and the like. This is because integrated circuits using SOI substrates attract attention since the parasitic capacitance between a drain of a transistor and a substrate can be reduced, which results in improved performance and reduced power consumption of the semiconductor integrated circuits.

As a method for manufacturing SOI substrates, a hydrogen ion implantation separation method is known (for example, Reference 1: U.S. Pat. No. 6,372,609). According to the hydrogen ion implantation separation method, hydrogen ions are implanted into a silicon wafer to form a microbubble layer at a predetermined depth from the surface, and the microbubble layer is used as a cleavage surface to bond a thin silicon layer (SOI layer) to another silicon wafer. In addition to heat treatment for separating the SOI layer, it is necessary to perform heat treatment in an oxidizing atmosphere to form an oxide film over the SOI layer, and after the oxide film is removed, it is necessary to perform heat treatment at 1000° C. to 1300° C. in a reducing atmosphere to increase the bonding strength.

On the other hand, there has been an attempt to form an SOI layer over an insulating substrate such as a glass substrate. As an example of an SOI substrate in which an SOI layer is formed over a glass substrate, it is known that a thin single crystal silicon layer is formed over a glass substrate having a coating film by a hydrogen ion implantation separation method (Reference 2: Japanese Published Patent Application No. H11-163363, and Reference 3: U.S. Pat. No. 7,119,365). Also in that case, hydrogen ions are implanted into a piece of single crystal silicon to form a microbubble layer at a predetermined depth from the surface, and the piece of single crystal silicon is bonded to a glass substrate and then separated with the microbubble layer used as a cleavage surface, whereby a thin silicon layer (SOI layer) is formed over the glass substrate.

A thin film transistor (TFT) formed over an insulating substrate such as a glass substrate has a structure in which a base insulating film, an active layer, a gate insulating film, a gate electrode, an interlayer insulating film, and a wiring are formed over the glass substrate. In order to increase the operation speed of a TFT, the design rule of the whole TFT has been reduced.

SUMMARY OF THE INVENTION

When the design rule of an integrated circuit is reduced to achieve higher integration, it is effective to reduce the area of a capacitor portion. In order to ensure necessary capacitance while reducing the area of the capacitor portion, there is a method of reducing the thickness of a dielectric layer of a capacitor element. However, the leakage current increases with reduction in thickness of the dielectric layer, leading to deterioration of characteristics of the capacitor element. Thus, it is an object of the invention to reduce the area of a capacitor portion while maintaining necessary capacitance without reducing the thickness of a dielectric layer.

A glass substrate cannot be subjected to heat treatment at a high temperature of about 700° C. or higher; therefore, it is difficult to perform high heat treatment on a dielectric layer of a capacitor element, which has been deposited over a glass substrate. Thus, it is another object of the invention to form a dielectric layer that needs high heat treatment over a substrate with a low temperature limit.

According to the invention, a semiconductor device includes a capacitor portion provided with a dielectric layer that contains a material with a relative permittivity of 10 or more, for example, yttrium oxide or a mixture of yttrium oxide and zirconium oxide.

According to the invention, a semiconductor device includes a storage capacitor portion provided with an insulating film that is deposited over a single crystal silicon substrate and subjected to heat treatment. The insulating film in the storage capacitor portion obtains specific crystal growth on the single crystal silicon and increases in relative permittivity, which results in reduction in area of the storage capacitor portion. In addition, the circuit design can be made without reducing the thickness of the insulating film in the storage capacitor portion; therefore, the storage capacitor portion having excellent charge retention characteristics can be obtained. According to an aspect of the semiconductor device of the invention, the insulating film in the storage capacitor portion is separated from a single crystal silicon substrate to be provided over a supporting substrate. Furthermore, according to an aspect of the semiconductor device of the invention, the insulating film in the storage capacitor portion is embedded in a second insulating layer over a first insulating layer that is provided over the supporting substrate.

The insulating film in the storage capacitor portion contains a material such as yttrium oxide or yttrium oxide mixed with zirconium oxide for chemical stabilization. The insulating film in the storage capacitor portion of the invention is deposited over single crystal silicon by sputtering or CVD, subjected to heat treatment at 750° C. or higher, and then bonded to a glass substrate. In combination with an electrode that is in contact with the insulating film in the storage capacitor portion, a storage capacitor with high reliability can be achieved.

The electrode that is in contact with the insulating film in the storage capacitor portion may be formed of a high-melting point metal or the single crystal silicon layer added with an impurity imparting conductivity.

The single crystal silicon substrate may have a crystal orientation {100}, {110}, or {111}.

In this specification, a material containing yttrium oxide and zirconium oxide is referred to as a YSZ (yttrium stabilized zircon), and a film containing the YSZ is referred to as a YSZ film.

When a capacitor portion is provided with a dielectric layer that contains a material with a relative permittivity of 10 or more, for example, yttrium oxide or a mixture of yttrium oxide and zirconium oxide, the capacitor portion in an integrated circuit can be reduced in area.

Before a crystalline silicon layer separated from a single crystal silicon substrate is bonded to a supporting substrate, a YSZ film as a high dielectric film is formed over the single crystal silicon substrate and heat treatment is performed, thereby obtaining a semiconductor device with a higher relative permittivity in which a capacitor portion in an integrated circuit is reduced in area. In particular, a desired semiconductor device can be manufactured by the aforementioned method even over a supporting substrate with an upper temperature limit of less than 750° C. that is a heat treatment temperature effective for a YSZ film. In addition, the circuit design can be made without reducing the thickness of the insulating film in the storage capacitor portion; therefore, the storage capacitor portion having excellent charge retention characteristics can be obtained.

DETAILED DESCRIPTION OF THE INVENTION

Figure 1A:
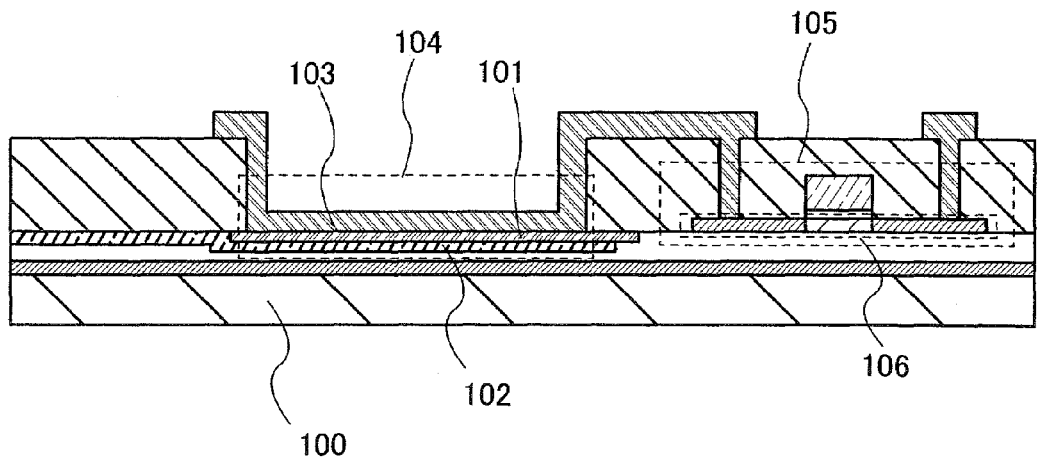
FIGS. 1A and 1B are cross-sectional views each illustrating a structure of a substrate having an SOI structure.

Although the preferred embodiment modes of the invention will be described below with reference to the accompanying drawings, it is to be understood that various changes and modifications will be apparent to those skilled in the art. Therefore, unless such changes and modifications depart from the scope of the invention, they should be construed as being included therein. In the structures of the invention described below, the identical portions are denoted by the identical reference numerals in different drawings.

Embodiment Mode 1

A structure of a semiconductor device according to the invention is described with reference to FIGS. 1A and 1B.

In FIG. 1A, a storage capacitor portion insulating layer 101 containing yttrium oxide or YSZ, a storage capacitor portion lower electrode 102, and a wiring 103 are formed over a supporting substrate 100. The wiring 103 also serves as a storage capacitor portion upper electrode. A storage capacitor portion 104 is formed at a position where a portion in which the storage capacitor portion lower electrode 102 is in contact with the storage capacitor portion insulating layer 101 overlaps a portion in which the storage capacitor portion insulating layer 101 is in contact with the wiring 103 as viewed from the top of the supporting substrate. A TFT 105 is formed over the same supporting substrate 100. The TFT 105 includes an active layer 106 that is a crystalline silicon layer. That is to say, the portion in which the storage capacitor portion lower electrode 102 is in contact with the storage capacitor portion insulating layer 101 is corresponding to the portion in which the storage capacitor portion insulating layer 101 is in contact with the wiring 103. Note that in this specification, "corresponding to" includes "substantially corresponding to".

The wiring 103 in FIG. 1A is electrically connected to a source and a drain of the TFT and is in contact with the storage capacitor portion insulating layer 101; however, the one wiring 103 does not necessarily satisfy the two conditions in designing circuits.

Figure 1B:
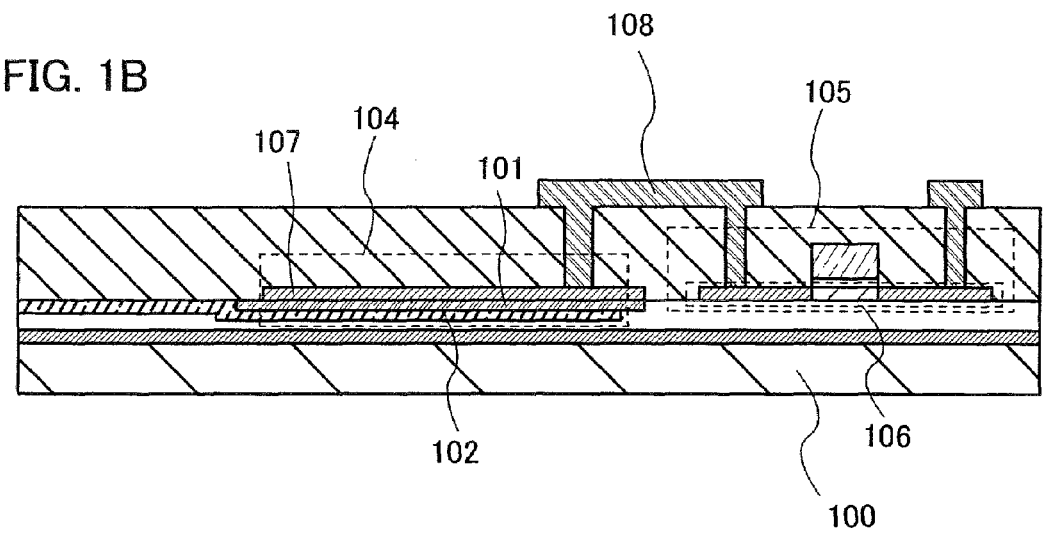

Although a semiconductor device in FIG. 1B is similar to that in FIG. 1A, a storage capacitor portion upper electrode 107 including a silicon layer is formed in contact with the storage capacitor portion insulating layer 101, and the storage capacitor portion upper electrode 107 is connected to a wiring 108. At this time, the storage capacitor portion 104 is formed at a position where a portion in which the storage capacitor portion insulating layer 101 is in contact with the storage capacitor portion lower electrode 102 overlaps a portion in which the storage capacitor portion insulating layer 101 is in contact with the storage capacitor portion upper electrode 107 as viewed from the top of the supporting substrate.

The wiring 108 in FIG. 1B is electrically connected to the source and the drain of the TFT and the storage capacitor portion upper electrode 107; however, the one wiring 108 is not necessarily connected to the two in designing circuits.

The supporting substrate 100 used in the invention is desirably made of a material having a heat resistance of 400° C. or higher. This is because heat treatment at 400° C. to 600° C. is performed in the step of bonding the crystalline silicon layer to the supporting substrate.

The supporting substrate 100 is an insulating substrate or a substrate having an insulating surface, and glass substrates (also referred to as "non-alkali glass substrates") that are used in the electronics industry, such as aluminosilicate glass substrates, aluminoborosilicate glass substrates, and barium borosilicate glass substrates are applied.

That is to say, the supporting substrate 100 may be a glass substrate that has a thermal expansion coefficient of $25 \times 10^{-7}/°$ C. to $50 \times 10^{-7}/°$ C. (preferably, $30 \times 10^{-7}/°$ C. to $40 \times 10^{-7}/°$ C.) and a strain point of 580° C. to 680° C. (preferably, 600° C. to 680° C.). Alternatively, a quartz substrate, a ceramic substrate, a metal substrate having a surface covered with an insulating film, or the like can be used.

The active layer 106 of the TFT is formed by slicing a single crystal silicon substrate, in other words, includes an LTSS (low temperature single crystal semiconductor) layer. For example, when a single crystal silicon substrate is used, the LTSS layer can be formed by a method in which ion irradiation is performed so as to add hydrogen or fluorine to a predetermined depth of the single crystal silicon substrate and then heat treatment is performed to separate a superficial single crystal silicon layer. Alternatively, another method may be applied in which single crystal silicon is epitaxially grown on porous silicon and then the porous silicon layer is separated by cleavage with water jetting. The thickness of the LTSS layer is 5 nm to 500 nm, and preferably 10 nm to 200 nm.

A method for manufacturing the substrate having an SOI structure illustrated in FIG. 1A is described with reference to FIGS. 2A to 2D, FIGS. 3A to 3D, FIGS. 4A to 4D, and FIGS. 5A to 5C.

First, an insulating film containing yttrium oxide or an insulating film containing yttrium oxide and zirconium oxide (a YSZ film) is formed over a surface of a single crystal silicon substrate 110. In this embodiment mode, a YSZ film 111 is deposited by sputtering to a thickness of 10 nm to 200 nm, here, 50 nm (see FIG. 2A). A mixture of 92 mol % yttrium oxide and 8 mol % zirconium oxide is used as a sputtering target, argon (Ar) and oxygen ($O_2$) are used as a deposition gas, and a deposition pressure is set to 0.4 Pa. Although the deposition is more effectively carried out at higher substrate temperature, the substrate temperature may be room temperature in the invention. Even when the target contains other additives, the object of the invention can be achieved as long as the crystallinity remains intact.

The deposition may be performed by CVD as well as by sputtering. The deposition is performed by CVD, for example, using a DPM complex containing zirconium and yttrium as a source material.

Yttrium oxide or YSZ has features of excellent heat resistance and chemical stability and easily growing in a specific crystal orientation with a crystalline silicon film used as a base. A natural oxide film that is not crystalline is formed over a surface of the crystalline silicon film, which does not significantly influence the crystal growth of yttrium oxide or YSZ. In addition, YSZ has a feature of having a higher relative permittivity when subjected to heat treatment.

The step of depositing the storage capacitor portion insulating layer over the single crystal silicon substrate and applying heat treatment needs to be performed before the step of bonding the storage capacitor portion insulating layer as well as the crystalline silicon layer to the supporting substrate, that is, the glass substrate. This is because heat treatment at 750° C. or higher is required for the crystal growth of yttrium oxide or YSZ The YSZ film 111 is crystallized by heat treatment at 750° C. to 1400° C., and preferably 850° C. to 950° C., which results in increased relative permittivity. In this embodiment mode, the heat treatment is performed at 900° C. for one hour in consideration of productivity and film characteristics.

Figure 2A:
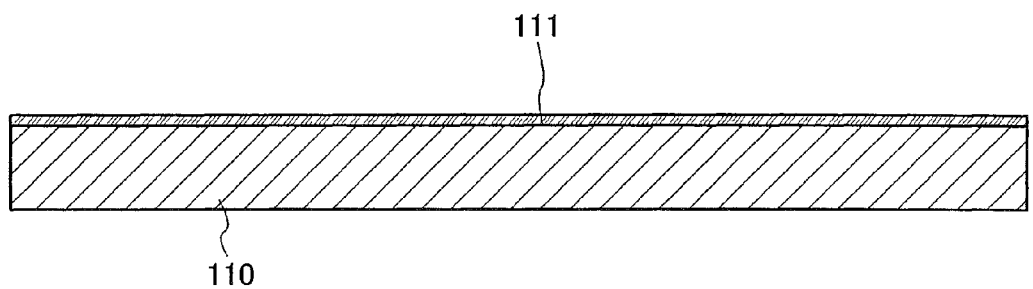
FIGS. 2A to 2D are cross-sectional views illustrating a method for manufacturing a substrate having an SOI structure.
Figure 2B:
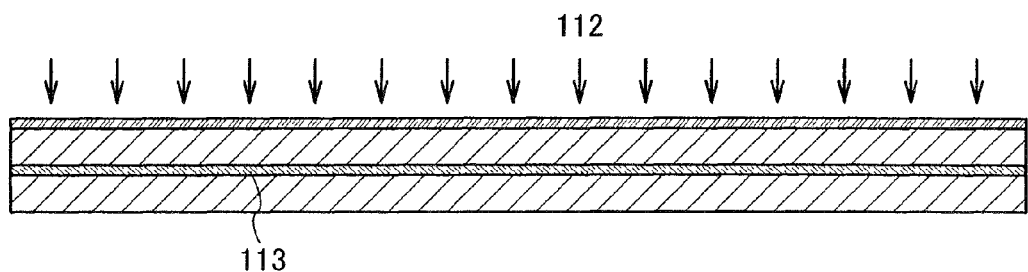

Subsequently, the cleaned surface of the single crystal silicon substrate 110 is irradiated with ions 112 accelerated by an electric field, whereby the ions 112 are added to a predetermined depth of the substrate and an embrittlement layer 113 is formed (see FIG. 2B). The depth of the embrittlement layer 113 formed in the single crystal silicon substrate 100 is controlled by ion acceleration energy and ion incident angle. The embrittlement layer 113 is formed in a region at a depth close to the average penetration depth of the ions from the surface of the single crystal silicon substrate 110. An LTSS layer has a thickness of, for example, 5 nm to 500 nm, and preferably 10 nm to 200 nm, and the acceleration voltage in the ion irradiation is determined in consideration of such a thickness. The ion irradiation is preferably performed using an ion doping apparatus. In other words, a doping method is used in which irradiation with a plurality of ions (ion species) generated by making a source gas into plasma is performed without mass separation.

In the preferred mode for implementing the invention, it is preferable that the single crystal silicon substrate 110 be irradiated with a single kind of ions or plural kinds of ions of the same atom, which have different mass numbers. Ion doping may be performed at an acceleration voltage of 10 keV to 100 keV, and preferably 30 keV to 80 keV, a dose of $1\times10^8/\text{cm}^2$ to $4\times10^8/\text{cm}^2$, and a beam current density of 2 $\mu\text{A/cm}^2$ or more, preferably 5 $\mu\text{A/cm}^2$ or more, and more preferably 10 $\mu\text{A/cm}^2$ or more.

In the case of irradiation with hydrogen ions, the hydrogen ions preferably include $H^+$, $H_2^+$, and $H_3^+$ ions with a high proportion of $H_3^+$ ions, whereby the irradiation efficiency of ions can be increased and the time for irradiation can be shortened. As a result, hydrogen can be contained in the embrittlement layer 113 formed in the single crystal silicon substrate 110 at a concentration of $1\times10^{20}/\text{cm}^3$ or more (preferably $5\times10^{20}/\text{cm}^3$ or more).

When the single crystal silicon substrate 110 is locally irradiated with a high concentration of hydrogen, a crystal structure is disturbed and microvoids are formed, whereby the embrittlement layer 113 can have a porous structure. In that case, a change in volume of the microvoids formed in the embrittlement layer 113 occurs by heat treatment at a relatively low temperature, and a thin LTSS layer can be formed by cleavage along the embrittlement layer 113.

Even when the single crystal silicon substrate 110 is irradiated with mass-separated ions, the embrittlement layer 113 can be formed similarly to the aforementioned case. In that case also, it is preferable that the single crystal silicon substrate 110 be selectively irradiated with ions having a larger mass number (e.g., $H_3^+$ ions) so as to achieve a similar effect to the aforementioned one.

Deuterium as well as hydrogen can be selected as a gas for producing ions. When the single crystal silicon substrate 110 is irradiated with such ions, microvoids can be formed and the embrittlement layer 113 similar to the aforementioned one can be formed in the single crystal silicon substrate 110.

In order to form the embrittlement layer 113, the single crystal silicon substrate 110 needs to be irradiated with ions at a high dose, which may cause roughness of the surface of the single crystal silicon substrate 110. Accordingly, a dense film may be provided on the surface that is irradiated with ions. For example, a silicon nitride film or an oxygen-containing silicon nitride film with a thickness of 50 nm to 200 nm may be provided as a protective film against ion irradiation.

Figure 2C:
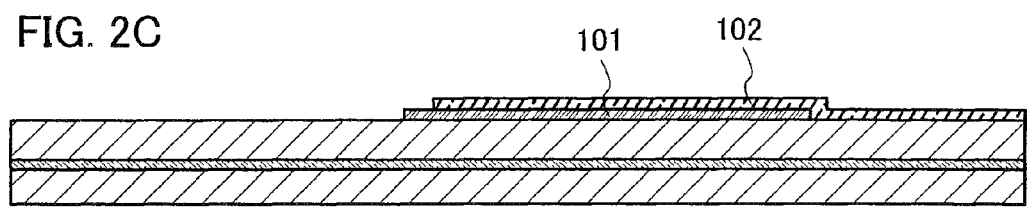

Then, the YSZ film 111 is selectively removed, thereby forming the storage capacitor portion insulating layer 101 into a desired shape (see FIG. 2C). In order to obtain the desired shape, dry etching may be performed using a noble gas or halogen. Alternatively, chemical mechanical polishing (CMP) may be performed. In that case, a silicon oxide film is formed in advance over the surface of the single crystal silicon substrate 110, a portion of the silicon oxide film, in which the storage capacitor portion insulating layer 101 is to be formed, is selectively removed, and then the YSZ film 111 is deposited and processed by CMP.

Next, the storage capacitor portion lower electrode 102 is formed of tungsten (W), molybdenum (Mo), titanium, or a material containing them (see FIG. 2C). In that case also, deposition is performed by sputtering, and selective removal is performed by dry etching using a gas added with halogen. A storage capacitor can be effectively provided over the supporting substrate when a portion in which the storage capacitor portion lower electrode 102 overlaps the storage capacitor portion insulating layer 101 has substantially the same shape as a portion in which the storage capacitor portion insulating layer 101 overlaps a storage capacitor portion upper electrode formed in a subsequent step.

The step of forming the embrittlement layer 113 is performed before the step of forming the storage capacitor portion insulating layer 101 into a desired shape and the step of forming the storage capacitor portion lower electrode 102. This is because in the step of forming the embrittlement layer 113 by ion irradiation to the predetermined depth, it is necessary to irradiate a flat surface with ions in order to introduce the ions into a uniform depth from the surface.

Figure 2D:
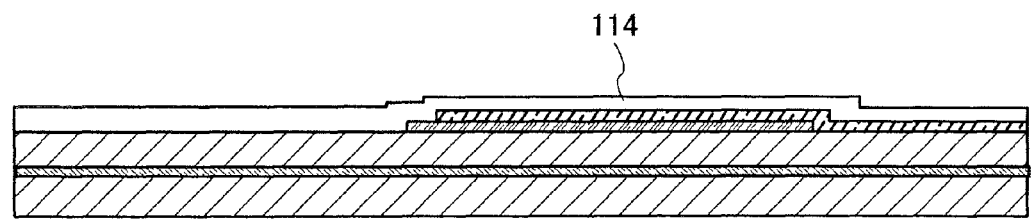

Then, an insulating film 114 is formed (see FIG. 2D). The insulating film 114 is formed as a stacked film of a nitrogen-containing silicon oxide film with a thickness of 100 nm and an oxygen-containing silicon nitride film with a thickness of 300 nm.

Figure 3A:
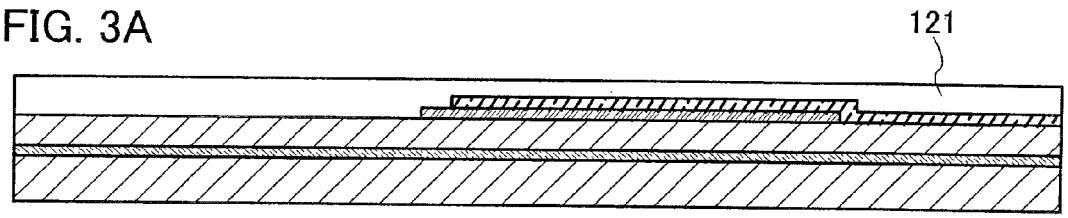
FIGS. 3A to 3E are cross-sectional views illustrating a method for manufacturing a substrate having an SOI structure.

The insulating film 114 is polished by CMP, thereby obtaining an insulating film 121 with a flat surface (see FIG. 3A). The insulating film 114 has irregularity due to the storage capacitor portion lower electrode 102 formed therebelow; however, the irregularity is eliminated by polishing.

Figure 3B:
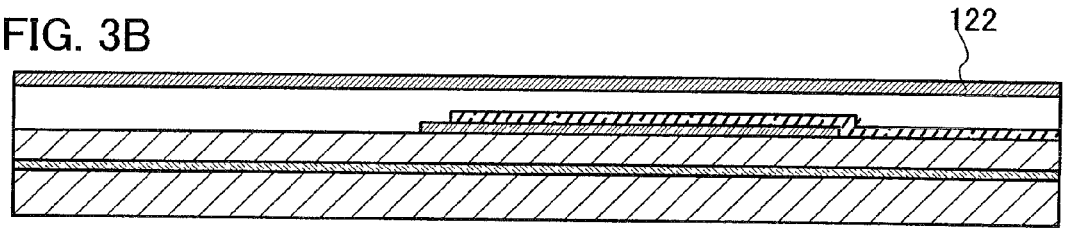
Figure 3C:
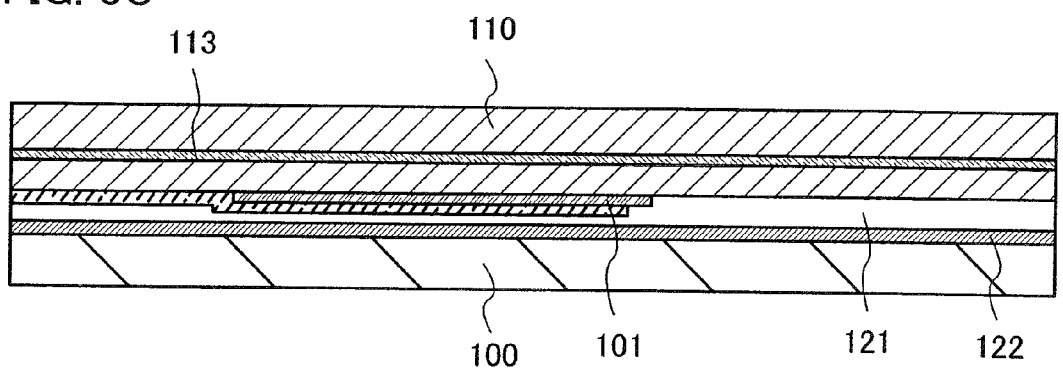
Figure 3D:
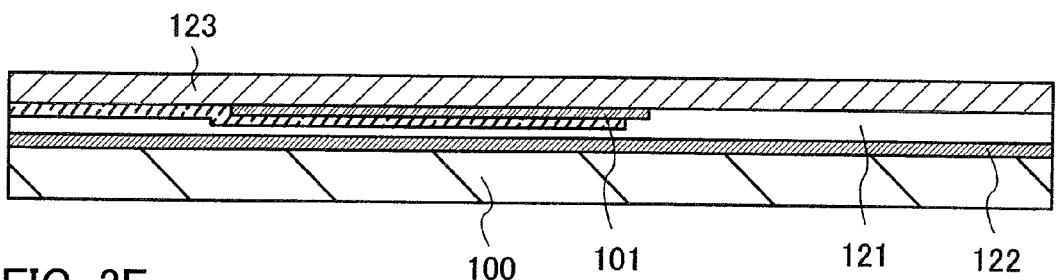

Next, a bonding layer 122 is formed over a surface of the single crystal silicon substrate 110, which is to be bonded to the supporting substrate 100 (see FIG. 3B). The bonding layer 122 is a layer having a flat surface, a layer having a hydrophilic surface, or a layer having a flat and hydrophilic surface. An insulating layer formed by a chemical reaction is preferably used as a layer having such a surface. For example, an oxide semiconductor film formed by a thermal or chemical reaction is suitable because a film mainly formed by a chemical reaction can ensure the flatness of its surface.

When the layer under the bonding layer 122 has a flat surface, the lower limit of the thickness of the bonding layer 122 to maintain the hydrophilicity is 1 nm. Even when the layer under the bonding layer 122 has irregularity, the flatness can be ensured by increasing the thickness of the bonding layer 122; however, the bonding layer 122 itself has irregularity if it becomes too thick. Accordingly, the bonding layer 122 is provided to have a thickness of 1 nm to 500 nm.

When the bonding layer 122 is formed of chemical oxide, it may have a thickness of 1 nm to 10 nm. Preferably, the bonding layer 122 is formed of silicon oxide deposited by chemical vapor deposition. In that case, it is preferable to use a silicon oxide film that is formed by chemical vapor deposition using an organosilane gas.

As the organosilane gas, any of the following silicon-containing compounds can be used: tetraethoxysilane (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

The bonding layer 122 provided on the surface of the single crystal silicon substrate 110, which is to be bonded to the support substrate 100, is firmly attached to the surface of the supporting substrate 100, whereby a bond can be obtained even at room temperature. In order to form a bond between the bonding layer 122 and the supporting substrate 100 that are made of different kinds of materials, the surfaces thereof are cleaned. When the cleaned surfaces of the supporting substrate 100 and the bonding layer 122 are brought into close contact with each other, a bond is formed by attractive force between the surfaces (see FIG. 3C).

It is more preferable for the bond formation that the surface of the supporting substrate 100 be treated to have many hydrophilic groups. For example, the surface of the supporting substrate 100 is preferably subjected to oxygen plasma treatment or ozone treatment so as to become hydrophilic.

When the surface of the supporting substrate 100 is thus treated to become hydrophilic, hydroxyl groups on the surface act to form a bond by hydrogen bonding. If the cleaned surfaces that are brought into close contact with each other and bonded together are heated at room temperature or higher, bonding strength can further be increased.

In order to form a favorable bond, the surfaces may be activated. For example, the surfaces that are bonded together are irradiated with an atomic beam or an ion beam. In the case of using an atomic beam or an ion beam, it is possible to use an inert gas neutral atom beam or inert gas ion beam of argon or the like. Alternatively, plasma irradiation or radical treatment may be performed. Such surface treatment makes it possible to increase the bonding strength between different kinds of materials even at a temperature of 200° C. to 400° C.

First heat treatment is conducted with the single crystal silicon substrate 110 and the supporting substrate 100 superposed on each other The single crystal silicon substrate 110 is separated by the first heat treatment while a thin silicon layer (LTSS layer) remains over the supporting substrate 100. The first heat treatment is preferably performed at a temperature equal to or higher than the temperature at which the bonding layer 122 is deposited, that is, at a temperature of equal to or higher than 400° C. and less than 600° C. At the result of the heat treatment at a temperature of this range, a change in volume of the microvoids formed in the embrittlement layer 113 occurs and the single crystal silicon substrate 110 can be separated from the supporting substrate 100 along the embrittlement layer 113. The bonding layer 122 is bonded to the supporting substrate 100; therefore, an LTSS layer 123 having the same crystallinity as the single crystal silicon substrate 110 is fixed over the supporting substrate 100 (see FIG. 3D).

Subsequently, second heat treatment is conducted while the LTSS layer 123 is attached over the supporting substrate 100. The second heat treatment is preferably performed at a temperature that is higher than that of the first heat treatment and does not exceed the strain point of the supporting substrate 100. Alternatively, it is preferable that the processing time of the second heat treatment be longer than that of the first heat treatment even when the first heat treatment and the second heat treatment are conducted at the same temperature. The heat treatment may be performed so that the supporting substrate 100 and/or the LTSS layer 123 are/is heated by thermal conduction heating, convection heating, radiation heating, or the like. As a heat treatment apparatus, an electrically-heated oven, a lamp annealing furnace, or the like can be used. The second heat treatment may be conducted at multiple temperatures. Alternatively, a rapid thermal annealing (RTA) apparatus may be used. If the heat treatment is performed using an RTA apparatus, the substrate can be heated to a temperature near or slightly higher than the strain point of the substrate.

Through the second heat treatment, the residual stress of the LTSS layer 123 can be relaxed. In other words, the second heat treatment reduces thermal distortion caused by a difference in expansion coefficient between the supporting substrate 100 and the LTSS layer 123. The second heat treatment is also effective in recovering the crystallinity of the LTSS layer 123, which has been damaged by ion irradiation. Furthermore, the second heat treatment is effective in recovering the damage of the LTSS layer 123, which is caused when the single crystal silicon substrate 110 and supporting substrate 100 that have been bonded together are separated by the first heat treatment. In addition, a hydrogen bond can be changed into a stronger covalent bond by both the first heat treatment and the second heat treatment.

In order to make the surface of the LTSS layer 123 more smooth, a chemical mechanical polishing (CMP) process may be performed. The CMP process can be conducted after the first heat treatment or the second heat treatment. Note that when the CMP process is performed before the second heat treatment, a damaged layer on the surface of the LTSS layer 123, which is caused by the CMP process while the surface of the LTSS layer 123 is flattened, can be recovered by the second heat treatment.

In any case, by combining the first heat treatment and the second heat treatment as described in this embodiment mode, a crystalline silicon layer with excellent crystallinity can be formed over a thermally-sensitive supporting substrate such as a glass substrate.

Figure 3E:
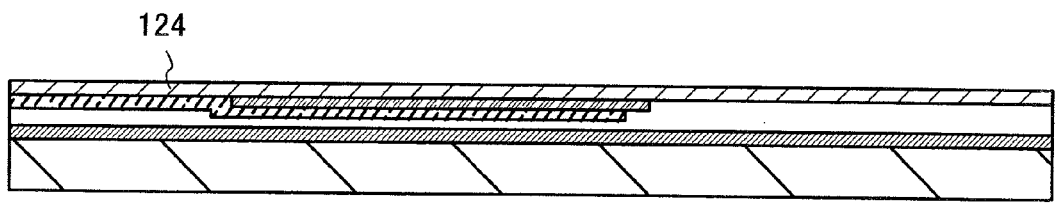

Subsequently, an LTSS layer 124 is obtained by reducing the LTSS layer 123 to a desired thickness (see FIG. 3E). The reduction in thickness can be performed by CMP, etching, or the like. In the preferred embodiment mode of the invention, the LTSS layer 123 is reduced in thickness by dry etching.

The LTSS layer 124 has a thickness of 5 nm to 500 nm, preferably 10 nm to 200 nm, and more preferably 10 nm to 60 nm. The thickness of the LTSS layer 124 can be set as appropriate by controlling the depth of the embrittlement layer 113 and changing the conditions for reducing the thickness. In the preferred embodiment mode of the invention, the LTSS layer 124 is formed by dry etching to a thickness of 50 nm.

A p-type impurity element such as boron, aluminum, or gallium is added to the LTSS layer 124 in order to control the threshold voltage. For example, boron may be added as a p-type impurity element at a concentration of $1\times10^{16}/\text{cm}^{-3}$ to $1\times10^{18}/\text{cm}^{-3}$.

Figure 4A:
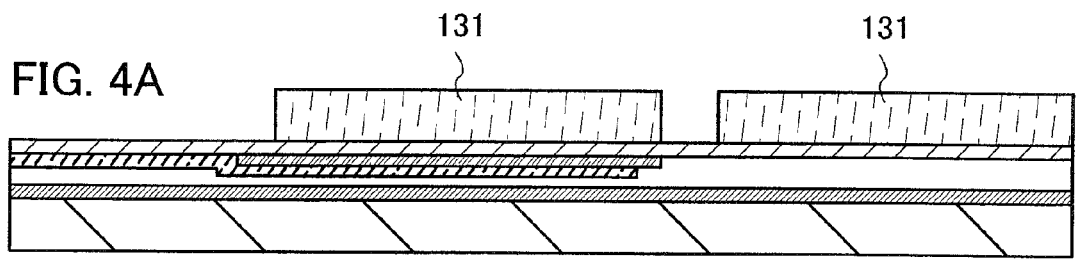
FIGS. 4A to 4D are cross-sectional views illustrating a method for manufacturing a substrate having an SOI structure.
Figure 4B:
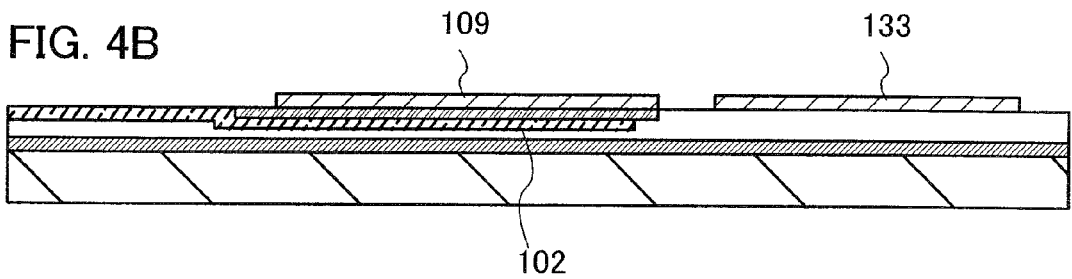

Masks 131 are formed over the LTSS layer 124, and the LTSS layer 124 is etched using the masks 131 (see FIG. 4A), thereby forming a protective layer 109 over the storage capacitor portion insulating layer 101, and an island-like single crystal silicon layer 133 that is island-like isolated based on the arrangement of the active layer (see FIG. 4B).

The storage capacitor portion lower electrode 102 and the protective layer 109 that are obtained through the aforementioned steps are formed so as not to be in contact with each other. This is to prevent the upper electrode and the lower electrode from being brought into contact to release charges if etching residue remains in processing the protective layer 109, since the protective layer 109 is made of single crystal silicon.

Figure 4C:
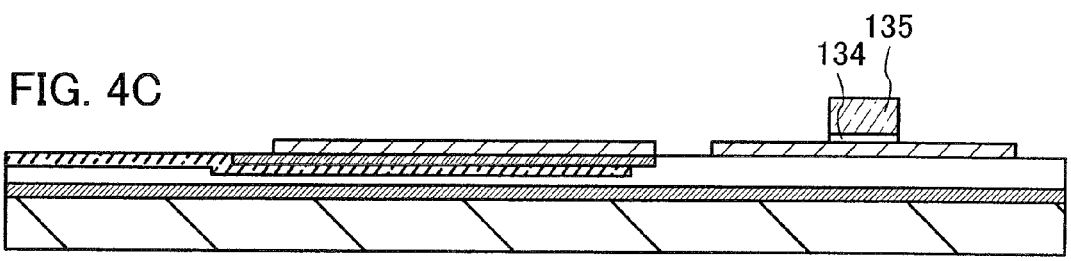

Then, a gate insulating film 134 and a gate electrode 135 are formed over the island-like single crystal silicon layer 133 (see FIG. 4C). The gate insulating film 134 and the gate electrode 135 have the same width in the preferred embodiment mode of the invention, the gate insulating film 134 may have a larger width than the gate electrode 135 in order to form a low concentration impurity region.

The gate insulating film 134 may be formed using any of a silicon oxide film, a silicon nitride film, a nitrogen-containing silicon oxide film, and an oxygen-containing silicon nitride film. In the preferred embodiment mode of the invention, the gate insulating film 134 is formed using a silicon oxide film with a thickness of 10 nm to 100 nm.

The gate electrode 135 may be formed of tungsten (W), tantalum (Ta), titanium (Ti), aluminum (Al), a nitride of any of these materials, a combination thereof, or the like.

Figure 4D:
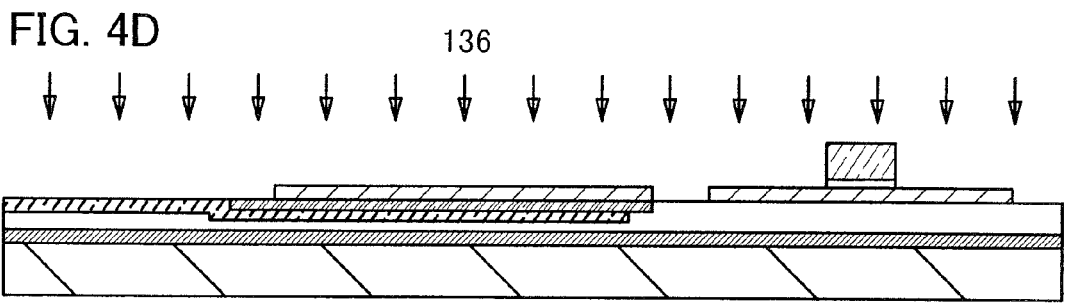

Subsequently, an impurity element 136 imparting one conductivity type is introduced into the island-like single crystal silicon layer 133 with the gate electrode 135 used as a mask (see FIG. 4D). At this time, the impurity element 136 is also added to the protective layer 109. When an impurity element imparting n-type conductivity is used as the impurity element 136, phosphorus (P) or arsenic (As) can be used. When an impurity element imparting p-type conductivity is used as the impurity element 136, boron (B) can be used.

Figure 5A:
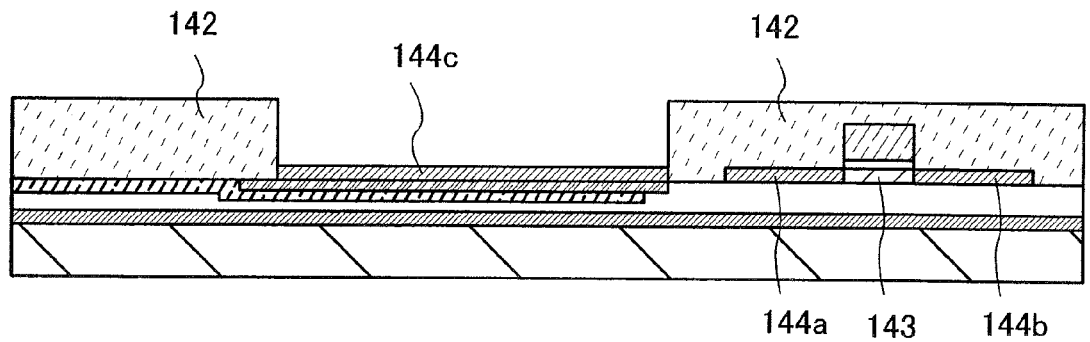
FIGS. 5A to 5C are cross-sectional views illustrating a method for manufacturing a substrate having an SOI structure.

By adding the impurity element 136 imparting one conductivity type, a channel forming region 143 is formed under the gate electrode 135, and high concentration impurity regions 144a and 144b that serve as a source region and a drain region, and a high concentration impurity region 144c are formed in regions that are not covered with the gate electrode 135 and the gate insulating film 134 (see FIG. 5A).

In the preferred embodiment mode of the invention, for example, phosphorus (P) is added as the n-type impurity element 136. Accordingly, the high concentration impurity regions 144a to 144c contain phosphorus at a concentration of $1\times10^{19}$ atoms/cm$^3$ to $1\times10^{21}$ atoms/cm$^3$ (typically, $1\times10^{20}$ atoms/cm$^3$ to $5\times10^{20}$ atoms/cm$^3$).

Subsequently, masks 142 are formed to cover the regions other than the protective layer 109 over the storage capacitor portion insulating layer 101. Then, the high concentration impurity region 144c is etched away to expose the storage capacitor portion insulating layer 101 (see FIG. 5B).

Figure 5B:
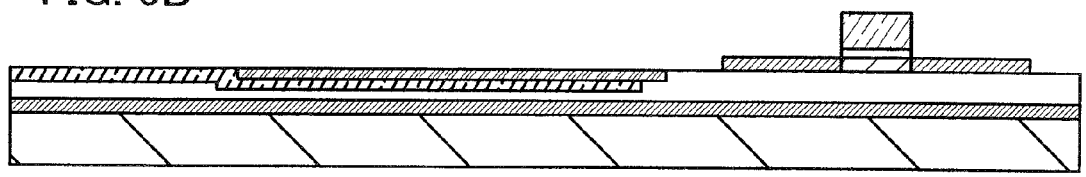

After the manufacturing steps up to FIG. 5B are completed, an interlayer insulating film 145 is formed. The interlayer insulating film 145 is formed by depositing a BPSG (boron phosphorus silicon glass) film or applying an organic resin typified by polyimide. Openings are formed in the interlayer insulating film 145, and a wiring 146 and a wiring 147 are formed (see FIG. 5C).

The wiring 146 and the wiring 147 may be formed of a material having a low contact resistance with the storage capacitor portion insulating layer 101 and the island-like single crystal silicon layer 133 that is an active layer. In the preferred embodiment mode of the invention, the wiring 146 and the wiring 147 are formed of aluminum or an aluminum alloy. A metal film of molybdenum, chromium, titanium, or the like may be formed as a barrier metal on an upper layer and a lower layer of the wirings The wiring 146 is electrically connected to the high concentration impurity region 144b, and the wiring 147 is electrically connected to the high concentration impurity region 144a and partially overlaps the storage capacitor portion insulating layer 101. A portion in which the wiring 147, the storage capacitor portion insulating layer 101, and the storage capacitor portion lower electrode 102 are overlapped constitutes a storage capacitor portion 104.

Figure 5C:
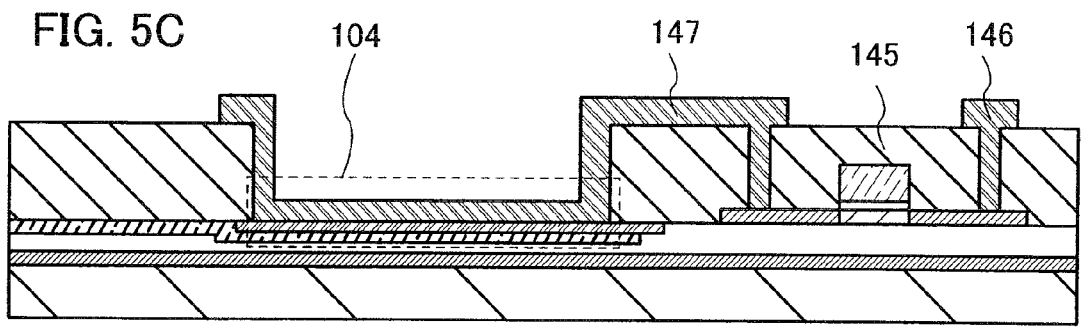

The manufacturing steps of FIG. 1A are described above. Next, manufacturing steps of FIG. 1B are described below with reference to FIGS. 6A to 6C. In the manufacturing method of FIG. 1B, the protective layer 109 is not removed but used as an upper electrode in the storage capacitor portion. Note that in FIGS. 6A to 6C, the same elements as those of FIGS. 5A to 5C are denoted by the same reference numerals.

Figure 6A:
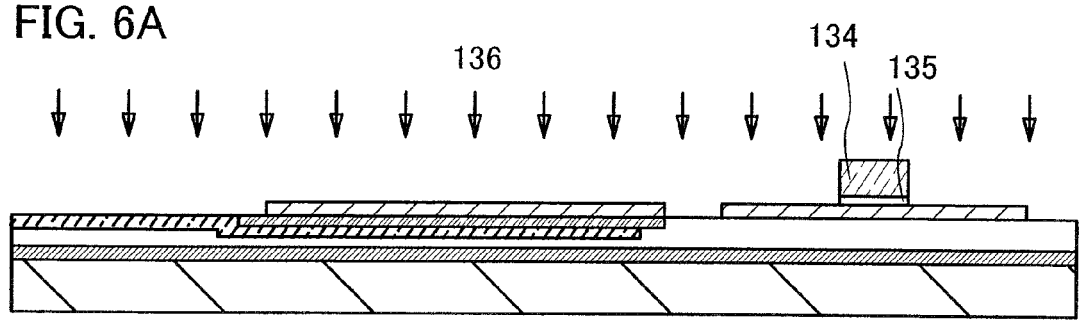
FIGS. 6A to 6C are cross-sectional views illustrating a method for manufacturing a substrate having an SOI structure.
Figure 6B:
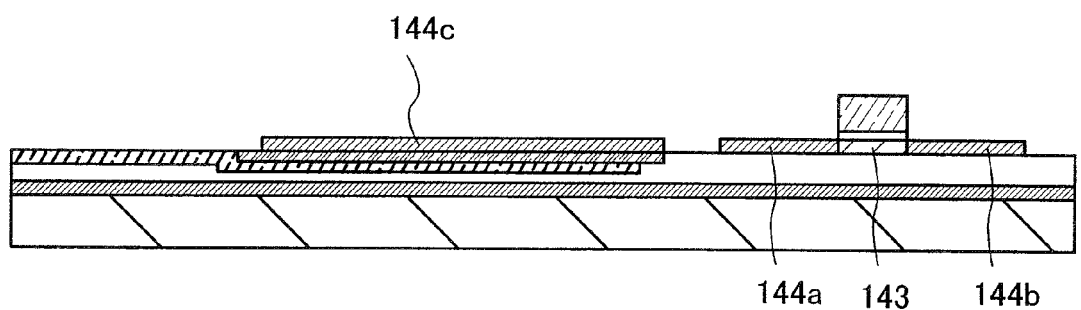

Similarly to the step of FIG. 1A, the impurity element 136 imparting one conductivity type is introduced into the island-like single crystal silicon layer 133 with the gate electrode 135 used as a mask (see FIG. 6A). At this time, the impurity element 136 is also added to the protective layer 109. Part of the protective layer 109, which overlaps the storage capacitor portion insulating layer 101, becomes the high concentration impurity region 144c to function as a storage capacitor portion upper electrode. The high concentration impurity region 144c is required to have a sufficiently low resistance. For example, the high concentration impurity region 144c may contain phosphorus at a concentration of $1\times10^{20}$ atoms/cm$^3$ to $1\times10^{21}$ atoms/cm$^3$.

Then, an interlayer insulating film 152 is formed. The interlayer insulating film 152 is formed by depositing a BPSG (boron phosphorus silicon glass) film or coating an organic resin typified by polyimide. Openings are formed in the interlayer insulating film 152, and the wiring 146 and a wiring 153 are formed (see FIG. 6C).

The wiring 146 and the wiring 153 may be formed of a material having a low contact resistance with the high concentration impurity region 144c serving as the storage capacitor portion upper electrode and the island-like single crystal silicon layer 133 that is an active layer.

The wiring 146 is electrically connected to the high concentration impurity region 144b, and the wiring 153 is electrically connected to the high concentration impurity region 144a and partially overlaps the storage capacitor portion insulating layer 101. A portion in which the high concentration impurity region 144c, the storage capacitor portion insulating layer 101, and the storage capacitor portion lower electrode 102 are overlapped constitutes a storage capacitor portion 104.

Figure 6C:
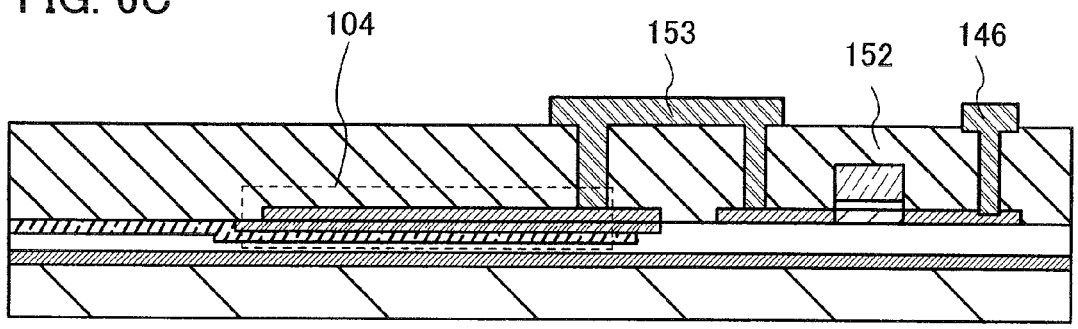

In order to obtain the structure of FIGS. 1A and 5C, when the protective layer 109 (the high concentration impurity region 144c) is plasma etched, the storage capacitor portion insulating layer 101 may be reduced in thickness or the storage capacitor portion insulating layer 101 itself may be damaged to be in a non-crystallized state. Accordingly, the wiring 147 of FIG. 5C (corresponding to the wiring 103 of FIG. 1A) is used as the upper electrode in the storage capacitor portion, which is advantageous in that the resistance of the electrode can be reduced and high-speed operation can be achieved. In the structure of FIGS. 1B and 6C, the protective layer 109 (the high concentration impurity region 144c) is used as the upper electrode in the storage capacitor portion. Since the protective layer 109 (the high concentration impurity region 144c) has a higher resistance than the wiring 147, the operation speed as the capacitor decreases. However, the structure of FIGS. 1B and 6C is advantageous in that the masks 142 (shown in FIG. 5A) used for plasma etching the protective layer 109 (the high concentration impurity region 144c) are not required, leading to reduction in the number of steps, and further the storage capacitor portion insulating layer 101 is not reduced in thickness and not exposed to plasma. By thus selecting the embodiment mode, increase in operation speed or improvement in productivity can be achieved more effectively.

As described above, by using a YSZ film with a high relative permittivity for a storage capacitor portion, a semiconductor device operating at high speed and having high reliability can be obtained, and for a similar reason, the storage capacitor portion can be reduced in area.

According to the preferred embodiment mode of the invention, the LTSS layer 123 that has a high bonding strength in a bonding portion can be obtained even over the supporting substrate 100 with an upper temperature limit of less than 750° C. such as a glass substrate. As the supporting substrate 100, the following varieties of glass substrates referred to as non-alkali glass substrates, which are used in the electronics industry, can be used: aluminosilicate glass substrates, aluminoborosilicate glass substrates, and barium borosilicate glass substrates. That is to say, a single crystal silicon layer can be formed over a substrate with a side of one meter or more. By using such a large size substrate, a semiconductor integrated circuit as well as a display device such as a liquid crystal display can be manufactured.

Embodiment Mode 2

In this embodiment mode, a semiconductor device including an SOI substrate and a TFT is described with reference to FIGS. 7 and 8.

Figure 7:
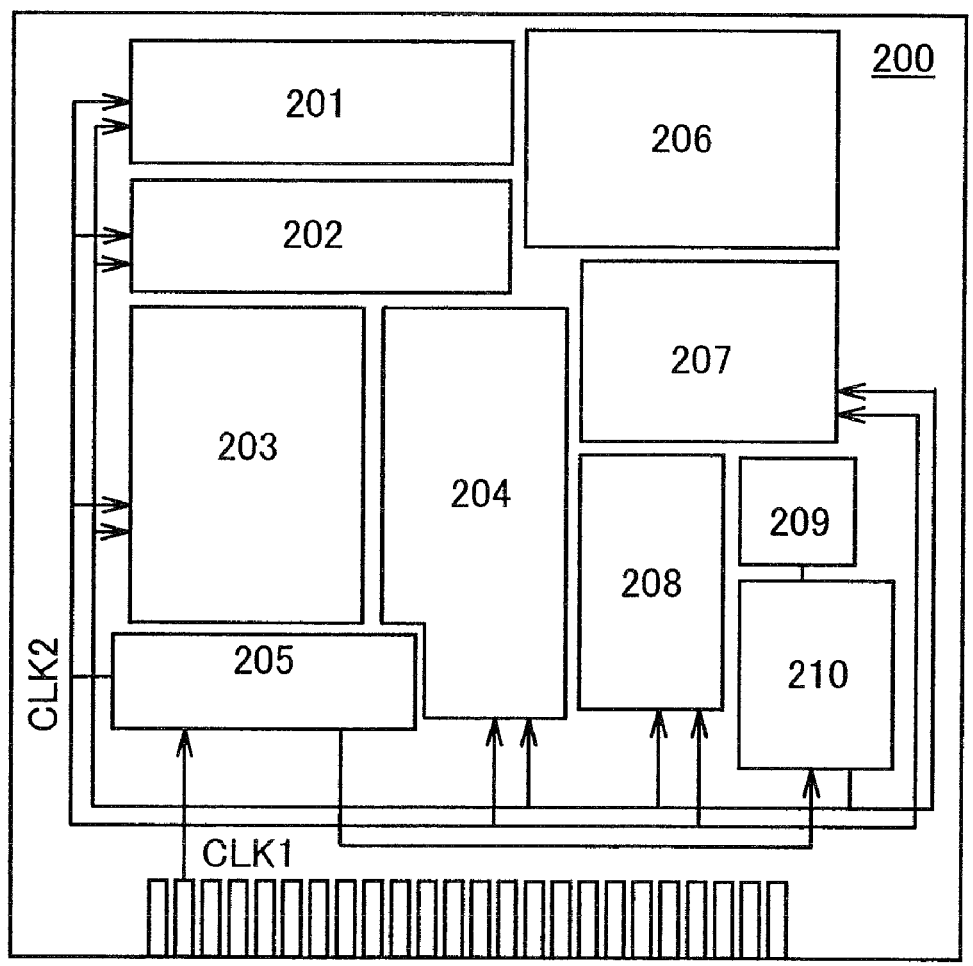
FIG. 7 is a block diagram illustrating a structure of a microprocessor that is obtained using a substrate having an SOI structure.

FIG. 7 illustrates a microprocessor 200 as an example of a semiconductor device. The microprocessor 200 includes an arithmetic logic unit (ALU) 201, an ALU controller 202, an instruction decoder 203, an interrupt controller 204, a timing controller 205, a register 206, a register controller 207, a bus interface (Bus I/F) 208, a read only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates a signal for controlling the operation of the ALU 201.

While the microprocessor 200 is executing a program, the interrupt controller 204 judges an interrupt request from an external input/output device or a peripheral circuit based on its priority or a mask state, and processes the request. The register controller 207 generates an address of the register 206, and reads/writes data from/to the register 206 in accordance with the state of the microprocessor 200. The timing controller 205 generates a signal for controlling the timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the aforementioned various circuits.

Note that the microprocessor 200 illustrated in FIG. 7 is only an example with a simplified configuration, and an actual microprocessor may have various configurations depending on the application.

In such a microprocessor 200, an integrated circuit includes a TFT having a single crystal silicon layer (LTSS layer) that is bonded to a supporting substrate and has a uniform crystal orientation, which results in higher processing speed. Furthermore, the electrode in the storage capacitor is reduced in area by using the YSZ film with a high relative permittivity; thus, the whole element can be reduced in area.

Next, an example of a semiconductor device having an arithmetic function that enables wireless data communication is described with reference to FIG. 8.

Figure 8:
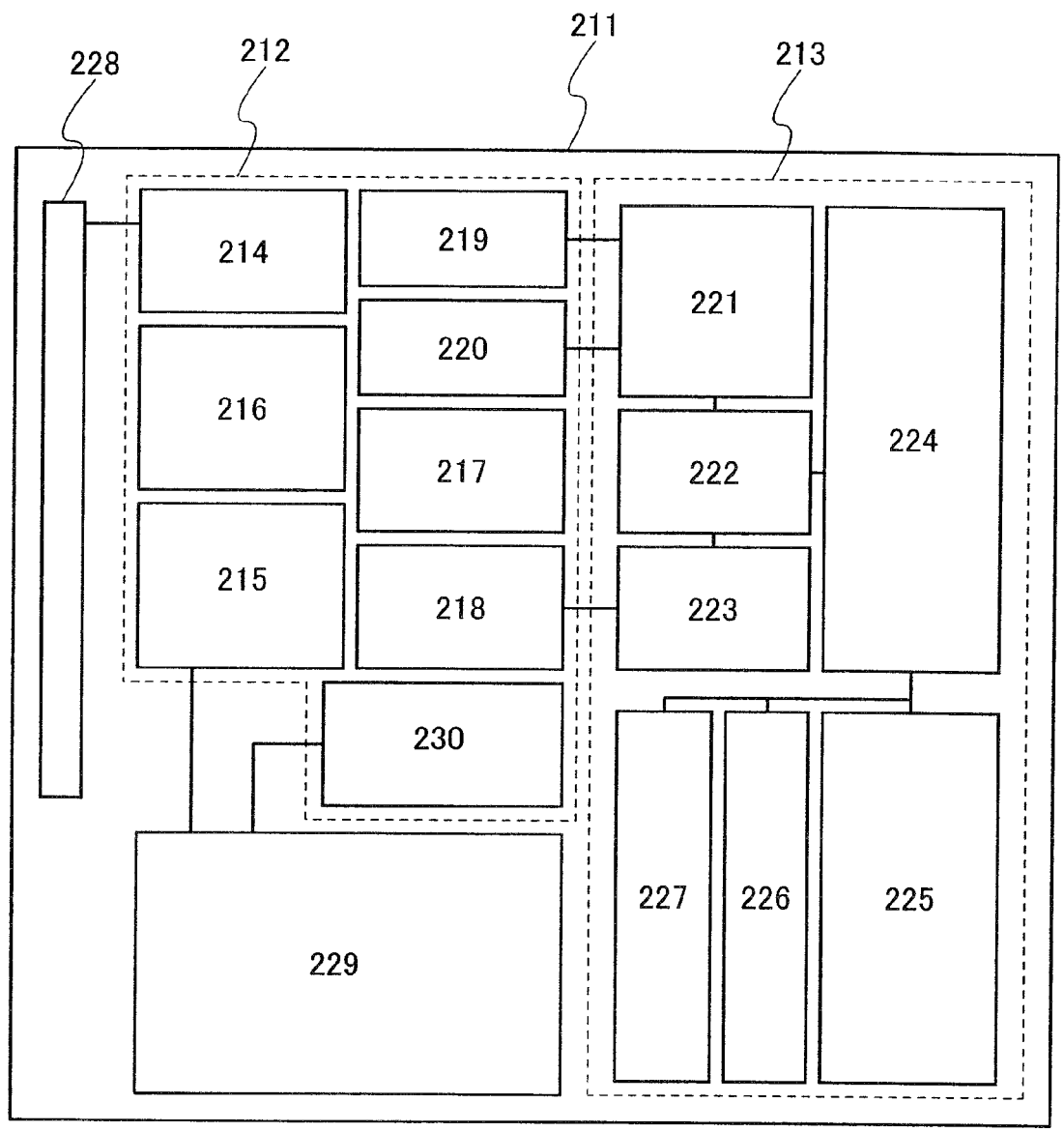
FIG. 8 is a block diagram illustrating a structure of an RFCPU that is obtained using a substrate having an SOI structure.

FIG. 8 illustrates an example of a computer (hereinafter referred to as an RFCPU) that operates by transmitting and receiving signals to and from an external device through wireless communication. An RFCPU 211 includes an analog circuit portion 212 and a digital circuit portion 213. The analog circuit portion 212 includes a resonance circuit 214 with a resonance capacitor, a rectifier circuit 215, a constant voltage circuit 216, a reset circuit 217, an oscillation circuit 218, a demodulation circuit 219, and a modulation circuit 220. The digital circuit portion 213 includes an RF interface 221, a control register 222, a clock controller 223, a CPU interface 224, a central processing unit (CPU) 225, a random access memory (RAM) 226, and a read only memory (ROM) 227.

The RFCPU 211 with such a configuration operates roughly in the following manner. The resonance circuit 214 generates an induced electromotive force based on a signal received by an antenna 228. The induced electromotive force is stored in a capacitor portion 229 through the rectifier circuit 215. This capacitor portion 229 preferably includes a capacitor such as a ceramic capacitor or an electric double layer capacitor.

The capacitor portion 229 can be formed using the YSZ film formed by the manufacturing method of the invention. The capacitor portion 229 does not need to be integrated with the RFCPU 211, and may be mounted as a different component over a substrate having an insulating surface that constitutes the RFCPU 211.

The reset circuit 217 generates a signal for resetting and initializing the digital circuit portion 213. For example, a signal that rises after an increase in power supply voltage is generated as the reset signal. The oscillation circuit 218 changes the frequency and the duty ratio of a clock signal in accordance with a control signal generated by the constant voltage circuit 216. The demodulation circuit 219 including a low-pass filter, for example, binarizes the amplitude of an amplitude shift keying (ASK) reception signal.

The modulation circuit 220 modulates the amplitude of an amplitude shift keying (ASK) transmission signal and transmits the data. The modulation circuit 220 varies the amplitude of a communication signal by changing the resonance point of the resonance circuit 214. The clock controller 223 generates a control signal for changing the frequency and the duty ratio of a clock signal in accordance with the power supply voltage or the current consumption of the CPU 225. The power supply voltage is monitored by a power supply control circuit 230.

A signal input from the antenna 228 to the RFCPU 211 is demodulated by the demodulation circuit 219 and then decomposed into a control command, data, and the like by the RF interface 221. The control command is stored in the control register 222. The control command includes reading of data stored in the ROM 227, writing of data to the RAM 226, an arithmetic instruction to the CPU 225, and the like.

The CPU 225 accesses the ROM 227, the RAM 226, and the control register 222 through the CPU interface 224. The CPU interface 224 has a function of generating a signal for accessing any of the ROM 227, the RAM 226, and the control register 222 based on the address requested by the CPU 225.

The arithmetic system of the CPU 225 may be such that an operating system (OS) is stored in the ROM 227 and a program is read and executed at the time of starting operation. It is also possible to employ a system in which an arithmetic circuit includes a dedicated circuit and the arithmetic processing is performed by hardware. In the case of employing a system combining hardware and software, part of the processing can be performed by a dedicated arithmetic circuit and the other part can be executed by the CPU 225 using a program.

Such an RFCPU 211 includes a single crystal silicon layer (LTSS layer) that is bonded to an insulating surface and has a uniform crystal orientation, which results in higher processing speed. Furthermore, the electrode in the storage capacitor is reduced in area by using the YSZ film with a high relative permittivity; thus, the whole element can be reduced in area.

Although FIG. 8 illustrates the RFCPU, the invention can also be applied to any other device having a communication function, an arithmetic processing function, and a memory function, for example, such as an IC tag.

This application is based on Japanese Patent Application serial No. 2007-250356 filed with Japan Patent Office on Sep. 27, 2007, the entire contents of which are hereby incorporated by reference.

What is claimed is:

1. A semiconductor device comprising:
   a first insulating layer;
   a second insulating layer over the first insulating layer;
   a lower electrode of a storage capacitor portion over a first portion of the second insulating layer;
   an insulating film of the storage capacitor portion formed over and in contact with a surface of the lower electrode of the storage capacitor portion, the insulating film of the storage capacitor portion including at least yttrium oxide;
   an island-like single crystal silicon layer over a second portion of the second insulating layer, the island-like single crystal silicon layer comprising a channel forming region and impurity regions;
   a gate electrode over the island-like single crystal silicon layer with a gate insulating film interposed therebetween;
   an interlayer insulating film covering the island-like single crystal silicon layer, the gate insulating film, the gate electrode, and the lower electrode of the storage capacitor portion; and
   a wiring over the interlayer insulating film,
   wherein the wiring is in contact with the insulating film of the storage capacitor portion, and
   wherein the lower electrode and the insulating film of the storage capacitor portion are embedded in the second insulating layer.

2. The semiconductor device according to claim 1, wherein the insulating film of the storage capacitor portion further includes zirconium oxide.

3. The semiconductor device according to claim 1, wherein the insulating film of the storage capacitor portion comprises YSZ.

4. The semiconductor device according to claim 1, wherein the wiring is in contact with one of the impurity regions in the island-like single crystal silicon layer.

5. The semiconductor device according to claim 1, wherein the second insulating layer is formed over a substrate comprising a material having a strain point of 700° C. or lower.

6. A semiconductor device comprising:
   a first insulating layer;
   a second insulating layer over the first insulating layer;
   a lower electrode of a storage capacitor portion over a first portion of the second insulating layer;
   an insulating film of the storage capacitor portion formed over and in contact with a surface of the lower electrode of the storage capacitor portion, the insulating film of the storage capacitor portion including at least yttrium oxide;
   a first island-like single crystal silicon layer over and in contact with the insulating film of the storage capacitor portion;
   a second island-like single crystal silicon layer over a second portion of the second insulating layer, the second island-like single crystal silicon layer comprising a channel forming region and impurity regions;
   a gate electrode over the second island-like single crystal silicon layer with a gate insulating film interposed therebetween;
   an interlayer insulating film covering the first and second island-like single crystal silicon layers, the gate insulating film, and the gate electrode; and
   a wiring over the interlayer insulating film,
   wherein the wiring is in contact with both of the first and second island-like single crystal silicon layers, and
   wherein the lower electrode and the insulating film of the storage capacitor portion are embedded in the second insulating layer.

7. The semiconductor device according to claim 6, wherein the insulating film of the storage capacitor portion further includes zirconium oxide.

8. The semiconductor device according to claim 6, wherein the insulating film of the storage capacitor portion comprises YSZ.

9. The semiconductor device according to claim 6, wherein the wiring is in contact with one of the impurity regions in the second island-like single crystal silicon layer.

10. The semiconductor device according to claim 6, wherein the second insulating layer is formed over a substrate comprising a material having a strain point of 700° C. or lower.

11. A semiconductor device comprising:
a first insulating layer;
a second insulating layer over the first insulating layer;
a lower electrode of a storage capacitor portion over a first portion of the second insulating layer;
an insulating film of the storage capacitor portion formed over and in contact with a surface of the lower electrode of the storage capacitor portion, the insulating film of the storage capacitor portion including at least yttrium oxide;
an island-like single crystal silicon layer over a second portion of the second insulating layer, the island-like single crystal silicon layer comprising a channel forming region and impurity regions;
a gate electrode over the island-like single crystal silicon layer with a gate insulating film interposed therebetween;
an interlayer insulating film covering the island-like single crystal silicon layer, the gate insulating film, the gate electrode, and the lower electrode of the storage capacitor portion, the interlayer insulating film having a first opening and a second opening; and
a wiring over the interlayer insulating film,
wherein the wiring is in contact with the island-like single crystal silicon layer through the first opening,
wherein the wiring is in contact with the insulating film of the storage capacitor portion in the second opening, and
wherein the lower electrode and the insulating film of the storage capacitor portion are embedded in the second insulating layer.

12. The semiconductor device according to claim 11, wherein the insulating film of the storage capacitor portion further includes zirconium oxide.

13. The semiconductor device according to claim 11, wherein the insulating film of the storage capacitor portion comprises YSZ.

14. The semiconductor device according to claim 11, wherein the wiring is in contact with one of the impurity regions in the island-like single crystal silicon layer.

15. The semiconductor device according to claim 11, wherein the second insulating layer is formed over a substrate comprising a material having a strain point of 700° C. or lower.

16. The semiconductor device according to claim 1, wherein the semiconductor device is one selected from the group consisting of a microprocessor, a computer which operates by wireless communication, and an IC tag.

17. The semiconductor device according to claim 6, wherein the semiconductor device is one selected from the group consisting of a microprocessor, a computer which operates by wireless communication, and an IC tag.

18. The semiconductor device according to claim 11, wherein the semiconductor device is one selected from the group consisting of a microprocessor, a computer which operates by wireless communication, and an IC tag.

* * * * *